United States Patent
Tseng et al.

(10) Patent No.: US 12,020,946 B2
(45) Date of Patent: Jun. 25, 2024

(54) CHEMICAL MECHANICAL POLISHING APPARATUS

(71) Applicant: Taiwan Semiconductor Manufacturing Co., Ltd., Hsinchu (TW)

(72) Inventors: Yu-Ping Tseng, Taipei (TW); Ren-Hao Jheng, Hsinchu County (TW)

(73) Assignee: Taiwan Semiconductor Manufacturing Co., Ld., Hsinchu (TW)

( * ) Notice: Subject to any disclaimer, the term of this patent is extended or adjusted under 35 U.S.C. 154(b) by 1530 days.

(21) Appl. No.: 16/194,640

(22) Filed: Nov. 19, 2018

(65) Prior Publication Data
US 2020/0043746 A1 Feb. 6, 2020

Related U.S. Application Data

(60) Provisional application No. 62/712,645, filed on Jul. 31, 2018.

(51) Int. Cl.
*H01L 21/321* (2006.01)
*B24B 9/06* (2006.01)
(Continued)

(52) U.S. Cl.
CPC .......... *H01L 21/3212* (2013.01); *B24B 9/065* (2013.01); *B24B 37/044* (2013.01); *B24B 37/24* (2013.01); *B24B 37/26* (2013.01)

(58) Field of Classification Search
CPC ..... B24B 53/017; B24B 53/12; B24B 53/005; B24B 53/02
See application file for complete search history.

(56) References Cited

U.S. PATENT DOCUMENTS 5,567,503 A * 10/1996 Sexton ..................... B24D 3/30
428/323
5,582,534 A * 12/1996 Shendon ................. B24B 37/30
451/291
(Continued)

FOREIGN PATENT DOCUMENTS

CN 1814410 A 8/2006
CN 101053069 A 10/2007
(Continued)

*Primary Examiner* — Joel D Crandall
(74) *Attorney, Agent, or Firm* — Sterne, Kessler, Goldstein & Fox. P.L.L.C.

(57) ABSTRACT

The present disclosure provides an apparatus and a method for polishing a semiconductor substrate in semiconductor device manufacturing. The apparatus can include: a carrier configured to hold the substrate; a polishing pad configured to polish a first surface of the substrate; a chemical mechanical polishing (CMP) slurry delivery arm configured to dispense a CMP slurry onto the first surface of the substrate; and a pad conditioner configured to condition the polishing pad. In some embodiments, the pad conditioner can include: a conditioning disk configured to scratch the polishing pad; a conditioning arm configured to rotate the conditioning disk; a plurality of magnetic screws configured to secure the conditioning disk onto the conditioning arm and including a respective plurality of screw heads; and a plurality of blocking devices respectively positioned beneath the plurality of screw heads and configured to block debris particles from entering exiting a respective plurality of screw holes.

20 Claims, 3 Drawing Sheets

(51) Int. Cl.
 *B24B 37/04* (2012.01)
 *B24B 37/24* (2012.01)
 *B24B 37/26* (2012.01)

(56) References Cited

U.S. PATENT DOCUMENTS

| | | | |
|---|---|---|---|
| 2003/0068963 A1* | 4/2003 | Vanell | B24B 37/20 |
| | | | 451/72 |
| 2007/0087672 A1 | 4/2007 | Benner | |
| 2010/0190417 A1* | 7/2010 | Watanabe | B24B 53/017 |
| | | | 451/288 |
| 2012/0270483 A1* | 10/2012 | Bae | B24D 7/066 |
| | | | 451/540 |
| 2013/0316630 A1 | 11/2013 | Rothenberg et al. | |

FOREIGN PATENT DOCUMENTS

| | | |
|---|---|---|
| CN | 102059633 A | 5/2011 |
| JP | H06155293 A | 6/1994 |

* cited by examiner

CHEMICAL MECHANICAL POLISHING APPARATUS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

A manufacturing process used to planarize layers of an IC is chemical mechanical polishing (CMP). The CMP process combines chemical removal with mechanical polishing. The CMP process polishes and removes materials from the wafer and can be used to planarize multi-material surfaces. Furthermore, the CMP process does not use hazardous gasses and can be a low-cost process.

BRIEF DESCRIPTION OF THE DRAWINGS

Aspects of the present disclosure are best understood from the following detailed description when read with the accompanying figures. In accordance with the common practice in the industry, various features are not drawn to scale. In fact, the dimensions of the various features can be arbitrarily increased or reduced for clarity of illustration and discussion.

DETAILED DESCRIPTION

Figure 1:
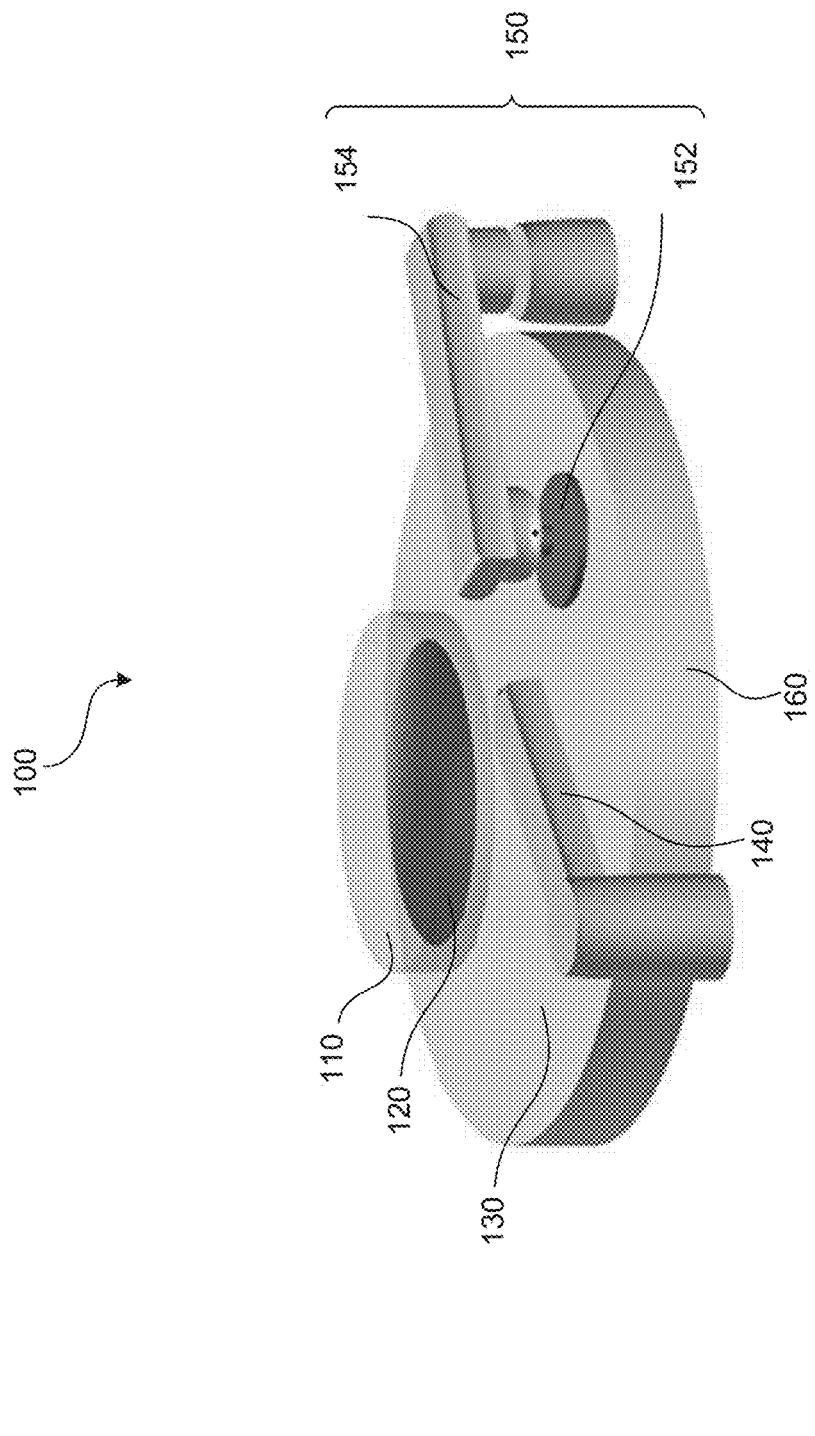
FIG. 1 is a schematic of a chemical mechanical polishing (CMP) apparatus, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows can include embodiments in which the first and second features are formed in direct contact, and can also include embodiments in which additional features are disposed between the first and second features, such that the first and second features are not in direct contact. In addition, the present disclosure can repeat reference numerals and/or letters in the various examples. This repetition does not in itself dictate a relationship between the various embodiments and/or configurations discussed.

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "horizontal," as used herein, means normally parallel to a level ground.

The term "vertical," as used herein, means nominally perpendicular to a level ground.

The term "substantially" as used herein indicates the value of a given quantity that can vary based on a particular technology node associated with the subject semiconductor device. Based on the particular technology node, the term "substantially" can indicate a value of a given quantity that varies within, for example, +5% of a target (or intended) value.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

The CMP process involves placing a wafer in a wafer carrier in an upside-down position with a surface that is being polished facing towards a polishing pad. The wafer carrier and the wafer are then rotated as a downward pressure is applied to the wafer against the polishing pad. A chemical solution, referred to as "a CMP slurry," is deposited onto the surface of the polishing pad to aid in the planarization process. Thus, the surface of the wafer can be planarized using a combination of mechanical (grinding) and chemical (CMP slurry) forces.

As part of the CMP process, the polishing pad can be conditioned using a pad conditioner. The pad conditioner can include a conditioning disk with a rough surface. The conditioning disk can be attached to a conditioning arm with a set of screws. The conditioning process can roughen and texturize the surface of the polishing pad to provide a rougher surface for better slurry distribution and polishing. The conditioning process can also remove accumulated debris build-up and excess slurry from the polishing pad.

However, this conditioning process can lead to wafer damage. During the CMP process, undesirable abrasive debris particles (e.g., iron debris particles) can be generated (e.g., in screw holes) as a result of friction (e.g., between a screw and a corresponding screw hole). The debris particles can become dislodged from the pad conditioner (e.g., from the screw holes located on the pad conditioner and used to secure the conditioning disk onto the conditioning arm) and get lodged onto the polishing pad. When a wafer is then polished using the polishing pad, the abrasive debris particles can cause peeled edges, scratches, and/or breaks in the wafer.

This disclosure is directed to an apparatus and a method for a CMP process that uses magnetic screws to secure the conditioning disk onto the conditioning arm with a blocking device. The blocking device covers a gap between the magnetic screw and the corresponding screw hole to prevent debris particles from being dislodged from the pad conditioner. Such CMP apparatus can reduce the amount of abrasive debris particles on the polishing pad, thus preventing wafer scratches and damage and improving wafer yield.

FIG. 1 is a schematic of a CMP apparatus 100, in accordance with some embodiments of the present disclosure. As illustrated in FIG. 1, CMP apparatus 100 can include a semiconductor substrate carrier 110, a polishing pad 130, a CMP slurry delivery arm 140 positioned over polishing pad 130, and a pad conditioner 150 positioned over polishing pad 130. Semiconductor substrate carrier 110 can be configured to hold and rotate a semiconductor substrate 120. Polishing pad 130 can be configured to polish semiconductor substrate 120. In some embodiments, both polishing pad 130 and semiconductor substrate carrier 110 rotate during the CMP process. In some embodiments, only one of polishing pad 130 and semiconductor substrate carrier 110 rotates during the CMP process. CMP slurry delivery arm 140 can be configured to deliver and dispense a CMP slurry onto polishing pad 130. Pad conditioner 150 can be configured to condition polishing pad 130 (e.g., roughen and texturize the surface of polishing pad 130).

Semiconductor substrate carrier 110 can be configured to hold and rotate semiconductor substrate 120. Semiconductor substrate 120 can be mounted in an upside-down position so a surface that is being polished faces polishing pad 130. In some embodiments, a vacuum can be applied to secure semiconductor substrate 120 on semiconductor substrate carrier 110. In some embodiments, semiconductor substrate carrier 110 is operable to bring semiconductor substrate 120 into contact with rotating polishing pad 130. By bringing semiconductor substrate 120 into contact with rotating polishing pad 130, polishing of the surface of semiconductor substrate 120 can be performed. In some embodiments, semiconductor substrate carrier 110 can further include a rotatable shaft (not shown in FIG. 1) to rotate semiconductor substrate 120. Semiconductor substrate carrier 110 can include a retainer ring to keep semiconductor substrate 120 in a predetermined position and prevent detachment of semiconductor substrate 120 from semiconductor substrate carrier 110. The retainer ring can be used to reduce lateral movement of semiconductor substrate 120 during the CMP process. In some embodiments, the retainer ring can have a hardness ranging from about 5 shore A to about 80 shore D. In some embodiments, suitable materials for the retainer ring can include, but is not limited to, polyvinyl alcohol (PVA), polyvinyl chloride (PVC), polyurethane (PU), polyethylene terephthalate (PET), polyethylene (PE), polystyrene (PS), polypropylene (PP), polycarbonates (PC), or a combination thereof. In some embodiments, the retainer ring is a non-porous material. In some embodiments, the retainer ring is a porous material. In some embodiments, a pore size in the retainer ring ranges from about 0.5 μm to about 100 μm. In some embodiments, a porosity of the retainer ring is equal to or less than about 70%. In some embodiments, a compressibility of the retainer ring ranges from about 1% to about 50%.

In some embodiments, semiconductor substrate 120 includes a semiconductor body as well as an overlying dielectric material layer (e.g., oxide) and an overlying metal layer. In some embodiments, the semiconductor body can include, but is not limited to, silicon, germanium, an III-V semiconductor material (e.g., a combination of one or more group III elements with one or more group V elements). The dielectric material layer and the metal layer can share a common interface that faces the rotating polishing pad 130. In some embodiments, the metal layer can include, but is not limited to, germanium, copper, or aluminum. In some embodiments, the dielectric material layer can include, but is not limited to, silicon dioxide. In some embodiments, semiconductor substrate 120 can be a wafer (e.g., a silicon wafer). In some embodiments, semiconductor substrate 120 can be (i) pure element semiconductor including silicon and germanium; (ii) a compound semiconductor including silicon carbide (SiC), gallium arsenide (GaAs), gallium phosphide (GaP), indium phosphide (InP), indium arsenide (InAs), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and indium antimonide (InSb); (iii) an alloy semiconductor including silicon germanium (SiGe); or (iv) a combination thereof. In some embodiments, semiconductor substrate 120 can be a semiconductor on insulator (SOI). In some embodiments, semiconductor substrate 120 can be an epitaxial material.

Polishing pad 130 can be configured to polish semiconductor substrate 120. In some embodiments, polishing pad 130 is located on a top surface of a platen 160, which rotates polishing pad 130 about an axis of rotation during the CMP process. Polishing pad 130 can be mounted on platen 160 by adhesive means. During the CMP process, polishing pad 130 can be pressed and brought into contact with a surface of semiconductor substrate 120 at a specific pressure. In some embodiments, polishing pad 130 can be several times the diameter of semiconductor substrate 120 and semiconductor substrate 120 is kept off-center on polishing pad 130 during the CMP process to prevent polishing a non-planar surface onto semiconductor substrate 120.

Polishing pad 130 can be a consumable item used in a semiconductor substrate fabrication process. In some embodiments, polishing pad 130 can be replaced after about 12 hours of usage during the CMP process. Polishing pad 130 can be a plate having a predetermined roughness (e.g., pore size), hardness, gravity, and/or pad compressibility. In some embodiments, polishing pad 130 can be a circular plate. Polishing pad 130 can be hard, incompressible polishing pads or soft polishing pads depending on the surface to be polished. For example, hard and stiffer polishing pads can be used for oxide polishing, to achieve planarity. Softer polishing pads can be used in other CMP processes (e.g., for copper and polysilicon polishing) to achieve improved uniformity and smooth surfaces. The hard polishing pads and the soft polishing pads can also be combined in an arrangement of stacked pads for customized applications. In some embodiments, polishing pad 130 can include porous polymeric materials with a pore size between about 30 μm and about 50 μm.

The hardness of polishing pad 130 can be measured in relative units based on the type and mode of indentation employed and indicate the ability of the polishing pad to maintain its shape. In some embodiments, a hard polishing pad material can have a rockwell hardness that is between about 30 and about 90 Shore A. In some embodiments, hard polishing pad material includes, but is not limited to, polyurethane, urethane, polymer, a filler material, and a combination thereof. A soft polishing pad material can include, but is not limited to, polyurethane impregnated felt or felt.

Specific gravity of polishing pad 130 can be determined at least in part by the porosity of the polishing pad. Pores in polishing pad 130 are important because they aid in slurry transport and in the removal of reaction products from the polish site. In some embodiments, the specific gravity of the polishing pad material can vary between about 0.6 and about 1.5 grams/cm$^3$.

Pad compressibility can dictate how polishing pad 130 conforms to the semiconductor substrate 120 surface undergoing polishing. To obtain a polishing rate that is uniform across semiconductor substrate 120 surface, the polishing pad should conform to the semiconductor substrate 120 surface on a long range scale. In some embodiments, the long range scale can vary between about 30 cm and about 50 cm. In some embodiments, a relatively highly compressible polishing pad material can have a compressibility between about 2 and about 50.

In some embodiments, polishing pad 130 can further include surface grooves (not shown in FIG. 1) to facilitate even distribution of the CMP slurry solution and to help trap undesirable particles formed by coagulated slurry solution or any other foreign particles which have fallen on top of polishing pad 130 during the CMP process.

Platen 160 can be configured to support and rotate polishing pad 130. In some embodiments, platen 160 can receive a rotational force from a motor (not shown in FIG. 1) disposed in a lower base (not shown in FIG. 1). Platen 160 can thus rotate around an imaginary rotational axis perpendicular to a top surface of platen 160. In some embodiments, platen 160 rotates polishing pad 130 in a clockwise direction. In some embodiments, platen 160 rotates polishing pad 130 in a counter-clockwise direction. Semiconductor substrate carrier 110 and polishing pad 130 can rotate independently in the same direction or different direction with the same or different rotational speed.

CMP slurry delivery arm 140 can be configured to deliver and dispense a CMP slurry onto polishing pad 130. The composition of the CMP slurry depends on the type of material on the semiconductor substrate surface undergoing the CMP process. In some embodiments, the CMP slurry can include a first reactant, an abrasive, a first surfactant, and a solvent.

The first reactant can be a chemical that reacts with a material of semiconductor substrate 120 (e.g., a conductive material) to assist polishing pad 130 in grinding away the material, such as an oxidizer. In some embodiments in which the material on the surface of semiconductor substrate 120 is tungsten, the first reactant can include, but is not limited to, hydrogen peroxide, hydroxylamine, periodic acid, ammonium persulfate, other periodates, iodates, peroxomono, sulfates, peroxymonosulfuric acid, perborates, malonamide, and a combination thereof. In some embodiments in which the material on the surface of semiconductor substrate is an oxide, the first reactant can include a Nitric acid ($HNO_3$) reactant.

The abrasive can be any suitable particles that, in conjunction with polishing pad 130, aids in the planarization of semiconductor substrate 120. In some embodiments, the abrasive can be colloidal silica (e.g., silicon oxide) or fumed silica. However, any other suitable abrasive, such as aluminum oxide, cerium oxide, polycrystalline diamond, polymer particles such as polymethacrylate or polymethacryclic, or a combination thereof, can alternatively be utilized. In some embodiments, the CMP slurry can be abrasive free (i.e., the CMP slurry does not include abrasive particles).

The first surfactant can be utilized to lower the surface tension of the CMP slurry and disperse the first reactant and the abrasive within the CMP slurry and also prevent or reduce the abrasive from agglomerating during the CMP process. In some embodiments, the first surfactant can include, but is not limited to, sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, potassium oleate, sulfosuccinates, sulfosuccinate derivatives, sulfates of alcohols, alkylanyl sulfonates, carboxylated alcohols, sulfonated amines, sulfonated amides, alkylamino propionic acids, alkyliminodipropionic acids, or a combination thereof.

The solvent can be utilized to combine the first reactant, the abrasive, and the first surfactant and allow the mixture to be moved and dispersed onto polishing pad 130. In some embodiments, the solvent can be deionized water, an alcohol, or a combination thereof.

Pad conditioner 150 can include a conditioning disk 152 mounted on a conditioning arm 154 with screws, in accordance with some embodiments. In some embodiments, conditioning arm 154 can be extended over the top of polishing pad 130 to sweep (e.g., in an arc motion) across the entire surface of polishing pad 130. As platen 160 rotates, different areas of polishing pad 130 can be fed under semiconductor substrate carrier 110 and used to polish the substrate. In some embodiments, platen 160 moves areas of polishing pad 130 that were previously in contact with semiconductor substrate 120 to pad conditioner 150. Conditioning arm 154 sweeps pad conditioner 150 across the areas previously used to polish the wafer and conditions these areas. Platen 160 then moves these areas back under semiconductor substrate carrier 110 and the wafer. In this manner, polishing pad 130 can be conditioned—e.g., simultaneously conditioned—while semiconductor substrate 120 is polished.

Conditioning disk 152 can have different compositions. In some embodiments, conditioning disk 152 can include a brazed grid-type conditioning disk, a diamond grid-type conditioning disk, or a combination thereof. A brazed grid-type conditioning disk can be formed by embedding or encapsulating diamond particles in random spacings with each other in the surface of a stainless steel substrate. A diamond grid-type conditioning disk can be formed by embedding cut diamonds at regular spacings in a nickel film coated onto the surface of a stainless steel substrate. The diamonds are coated with a diamond-like carbon (DLC) layer. Conditioning disk 152 can be used to roughen and condition a surface of polishing pad 130. Due to the conditioning by conditioning disk 152, the surface of polishing pad 130 is refreshed and the CMP rate can be maintained. The pad conditioning process can be carried out either during a CMP process, i.e. known as concurrent conditioning, or after a CMP process.

Figure 2B:
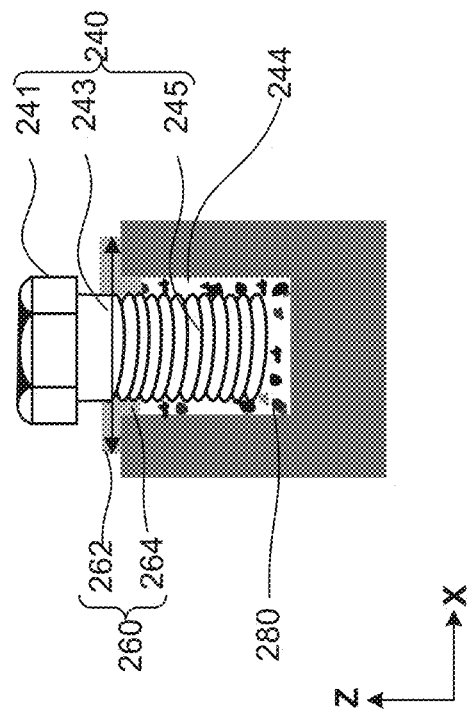
FIG. 2B is a schematic of a connection component between a conditioning disk and a conditioning arm in a side view, in accordance with some embodiments of the present disclosure.
Figure 2C:
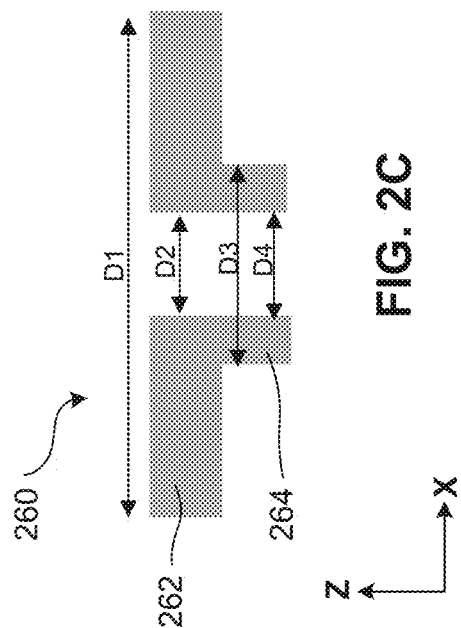
FIG. 2C is a schematic of a blocking device in a side view, in accordance with some embodiments of the present disclosure.
Figure 2A:
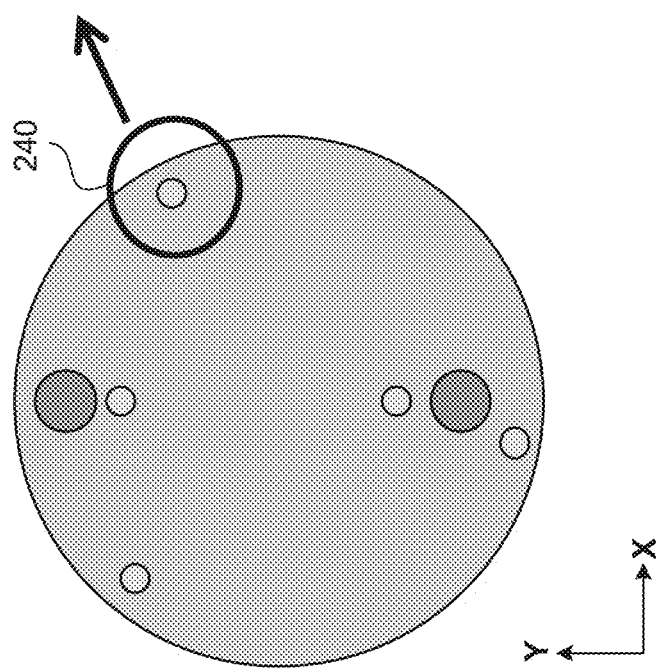
FIG. 2A is a schematic of a partial view of a conditioning disk illustrating a connection between a conditioning disk and a conditioning arm in a top down view, in accordance with some embodiments of the present disclosure.

FIG. 2A is a schematic of a partial view of a conditioning disk illustrating a connection between a conditioning disk and a conditioning arm, in accordance with some embodiments of the present disclosure. FIG. 2B is a schematic of a connection component between a conditioning disk and a conditioning arm in a side view, in accordance with some embodiments of the present disclosure. FIG. 2C is a schematic of a blocking device in a side view, in accordance with some embodiments of the present disclosure.

Referring to FIG. 2A, conditioning disk 152 can be mounted onto conditioning arm 154 with screws 240.

Referring to FIG. 2B, undesirable abrasive debris particles (e.g., iron debris particles 280) can be generated (e.g., in a screw hole 244) as a result of friction (e.g., between a screw 240 and corresponding screw hole 244). The debris particles can become dislodged from screw holes 244 and migrate to polishing pad 130. When semiconductor substrate 120 is then polished using polishing pad 130, iron debris particles 280 can cause peeled edges, scratches, or breaks in semiconductor substrate 120.

In some embodiments, screw 240 can be a magnetic screw. The magnetic screw can include, but is not limited to, iron, nickel, cobalt, or a combination thereof. The magnetic screw can produce a magnetic field and attract iron debris particles 280 preventing it from being dislodged from screw holes 244. In some embodiments, screw 240 can have a screw head 241, a screw shank 243, and a screw root 245. In some embodiments, a diameter of screw head 241 can range between about 6 mm and about 12 mm. In some embodiments, a diameter of screw shank 243 can range between about 2 mm and about 8 mm. In some embodiments, a diameter of screw root 245 can range between about 2 mm and about 8 mm. In some embodiments, a diameter of screw hole 244 in which screw 240 is located, can range between about 4 mm and about 8 mm.

A blocking device 260 can be inserted between screw head 241 and screw hole 244, covering the gap between the magnetic screw and the corresponding screw hole, to block debris particles 280 from exiting screw hole 244. Blocking device 260 can include a flange 262 and a skirt 264. Flange 262 can fit between screw head 241 and a top surface of screw hole 244. Skirt 264 can fit between screw shank 243 and/or screw root 245 and a sidewall of screw hole 244.

Referring to FIG. 2C, in some embodiments, an outer diameter (D1) of flange 262 can range between about 4 mm and about 20 mm. In some embodiments, an inner diameter (D2) of flange 262 can range between about 1 mm and about 8 mm. In some embodiments, an outer diameter (D3) of skirt 264 can range between about 4 mm and about 10 mm. In some embodiments, an inner diameter (D4) of skirt 264 can range between about 1 mm and about 8 mm. The specific size of blocking device 260 should be determined based on the size of each screw 240 to ensure full coverage of the gap between screw 240 and screw hole 244. For example, the outer diameter of flange 262 should be larger than the diameter of screw hole 244. The inner diameter of flange 262 should be the same or less than the diameter of screw 240. The outer diameter of skirt 264 should be the same or larger than the diameter of screw hole 244. The inner diameter of skirt 264 should be the same or less than the diameter of screw 240.

In some embodiments, blocking device 260 includes polyvinyl alcohol (PVA), polyvinyl chloride (PVC), polytetrafluoroethylene (PTFE), polyurethane (PU), polyethylene terephthalate (PET), polyethylene (PE), polystyrene (PS), polypropylene (PP), polycarbonate (PC), or a combination thereof. Blocking device 260 can have a hardness ranging from about 5 shore A to about 80 shore D. In some embodiments, a compressibility of blocking device 260 ranges from about 1% to about 50%. Compressibility is a measure of a change in volume of blocking device 260 at a native state to a volume during the CMP process. In some embodiments, compressibility is determined based on an equation $C=(T_1-T_2)/T_1 \times 100$, where C is compressibility, $T_1$ is a thickness of a sample experiencing a compressive stress of 300 g/cm$^2$, and $T_2$ is a thickness of the sample experiencing a compressive stress of 1800 g/cm$^2$. The thickness measurements are made using constant compressive stress at a temperature of about 25° C.

Figure 3:
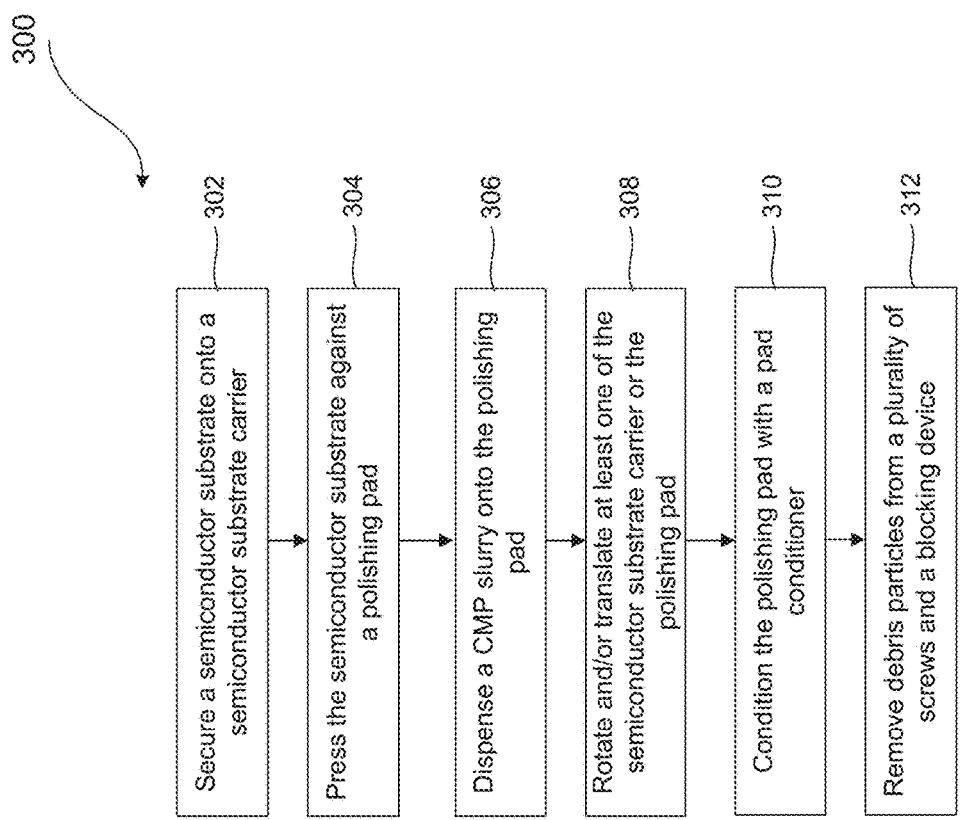
FIG. 3 is a flow chart of a chemical mechanical polishing (CMP) method, in accordance with some embodiments of the present disclosure.

FIG. 3 is a flow chart of a chemical mechanical polishing method 300, in accordance with some embodiments of the present disclosure. Operations shown in method 300 are not exhaustive; other operations can be performed as well before, after, or between any of the illustrated operations. In some embodiments, operations of method 300 can be performed in a different order. Variations of method 300 are within the scope of the present disclosure.

In operation 302, a semiconductor substrate (e.g., semiconductor substrate 120 as shown in FIG. 1) is secured onto a semiconductor substrate carrier (e.g., semiconductor substrate carrier 110 as shown in FIG. 1). The semiconductor substrate is secured in the semiconductor substrate carrier at least partially by a retainer ring, which can keep the semiconductor substrate in a predetermined position and prevent detachment of the semiconductor substrate during the CMP process. In some embodiments, a vacuum can be applied to help secure the semiconductor substrate on the semiconductor substrate carrier.

In operation 304, the semiconductor substrate is pressed against a polishing pad (e.g., polishing pad 130 as shown in FIG. 1). During the CMP process, the polishing pad can be pressed and brought into contact with a surface of the semiconductor substrate at a specific pressure. The pressure with which the semiconductor substrate is pressed against the polishing pad can be determined by moving the semiconductor substrate carrier in a direction perpendicular to a surface of the polishing pad. The retainer ring in the semiconductor substrate carrier is also pressed against the polishing pad during operation 304.

In operation 306, a CMP slurry is dispensed onto the polishing pad via a CMP slurry delivery arm (e.g., CMP slurry delivery arm 140 as shown in FIG. 1). The composition of the CMP slurry depends on the type of material on the surface of semiconductor substrate undergoing the CMP process. In some embodiments, the CMP slurry can include a first reactant, an abrasive, a first surfactant, and a solvent. The first reactant can be a chemical that reacts with a material of the semiconductor substrate to assist the polishing pad in grinding away the material, such as an oxidizer. The abrasive can be any suitable particles that, in conjunction with the polishing pad, aids in the planarization of the semiconductor substrate. The first surfactant can be utilized to lower the surface tension of the CMP slurry and disperse the first reactant and the abrasive within the CMP slurry and also prevent or reduce the abrasive from agglomerating during the CMP process. The solvent can be utilized to combine the first reactant, the abrasive, and the first surfactant and allow the mixture to be moved and dispersed onto the polishing pad. In some embodiments, a flow rate of the CMP slurry from the CMP slurry delivery arm is constant during the CMP process. In some embodiments, the CMP slurry flow rate from the CMP slurry delivery arm is variable. In some embodiments, prior to the CMP process of the semiconductor substrate, time is allotted to warm the polishing pad and facilitate flow of polishing slurry from a CMP slurry container (not shown in FIG. 1) to the CMP slurry delivery arm. This can enhance polishing uniformity across multiple semiconductor substrates polished using the CMP apparatus (e.g., CMP apparatus 100 as shown in FIG. 1).

In operation 308, the semiconductor substrate carrier or the polishing pad is rotated and/or translated. In some embodiments, the semiconductor substrate carrier rotates with respect to the polishing pad. In some embodiments, the semiconductor substrate carrier is translated with respect to the polishing pad. A rate of movement of the semiconductor substrate carrier can be constant or variable during operation 308. The semiconductor substrate carrier can remain stationary during operation 308. Alternatively, the polishing pad rotates with respect to the semiconductor substrate carrier. A direction of rotation of the polishing pad is opposite to a direction of rotation of the semiconductor substrate carrier. Further, the polishing pad can have a rate of rotation equal to, or different from, a rate of rotation of the semiconductor substrate carrier.

In some embodiments, the polishing pad can be several times the diameter of the semiconductor substrate and the semiconductor substrate is kept off-center on the polishing pad during the CMP process to prevent polishing a non-planar surface onto the semiconductor substrate. The semiconductor substrate can also be rotated (e.g., by a rotatable shaft) to prevent polishing a taper into the semiconductor substrate. Although the axis of rotation of the semiconductor substrate and the axis of rotation of polishing pad are not collinear, the axes are parallel.

In operation 310, the polishing pad is conditioned with a pad conditioner (e.g., pad conditioner 150 as shown in FIG. 1). The polishing pad can have a porous structure and a rough polishing surface. When the CMP process is performed, polishing debris (e.g., from the removed portion of the semiconductor substrate and the CMP slurry) fills the pores of the polishing pad. Therefore, the polishing surface becomes smooth, and the surface roughness of the polishing pad is decreased. As a result, the polishing rate is decreased. To maintain the polishing rate, the polishing pad needs to be conditioned to maintain the surface roughness. Conditioning operation 310 can be performed on the polishing pad. The pad conditioner can include a conditioning disk (e.g., conditioning disk 152) configured to roughen a surface of the polishing pad, a conditioning arm (e.g., conditioning arm 154) configured to translate and rotate the conditioning disk, screws (e.g., screws 240) configured to secure the conditioning disk onto the conditioning arm, and a blocking device (e.g., blocking device 260) configured to block debris particles. In some embodiments, the conditioning arm is extended over the top of the polishing pad to sweep (e.g., in an arc motion) across the entire surface of the polishing pad. In some embodiments, as the polishing pad is rotated by a platen (e.g., platen 160), different areas of the polishing pad can be fed under the semiconductor substrate carrier and used to polish the semiconductor substrate. The platen moves areas of the polishing pad that were previously in contact with the semiconductor substrate to the pad conditioner. In some embodiments, the conditioning arm sweeps the pad conditioner across the areas previously used to polish the semiconductor substrate and conditions these areas. The platen then moves these areas back under the semiconductor substrate carrier and the semiconductor substrate. In this manner, the polishing pad can be simultaneously conditioned while the semiconductor substrate is polished. In some embodiments, the pad conditioning process can also be carried out after the CMP process.

In operation 312, the debris particles generated during the CMP process inside the screw hole is removed from the screws and the blocking device. Undesirable abrasive debris particles (e.g., iron debris particles 280 as shown in FIG. 2B) can be generated (e.g., in a screw hole 244 as shown in FIG. 2B) as a result of friction (e.g., between screw 240 and its corresponding screw hole 244). The debris particles can become dislodged from the screw holes, and get lodged on the polishing pad causing peeled edges, scratches, or breaks in the semiconductor substrate during the CMP process. In some embodiments, the screws can be magnetic screws to attract iron debris particles and prevent it from being dislodged from the screw holes. The blocking device can be inserted between a screw head (e.g., screw head 241 as shown in FIG. 2B) and the screw hole, covering the gap between the magnetic screw and the corresponding screw hole, to block debris particles. After multiple runs of the CMP process (e.g., 12 hours of usage), the conditioning disk can be detached from the conditioning arm by unfastening the screws. The debris particles generated during the CMP process inside the screw hole can then be removed from screws and the blocking device (e.g., by rinsing in a suitable cleaning fluid).

The present disclosure provides an apparatus and a method for a CMP process that uses magnetic screws to secure the conditioning disk onto the conditioning arm with a blocking device. The blocking device can cover a gap between the magnetic screw and the corresponding screw hole to prevent debris particles from being dislodged from the pad conditioner. Such CMP apparatus can reduce the amount of abrasive debris particles on the polishing pad, thus preventing wafer scratches, peeled edges, and/or and improving wafer yield.

Various embodiments in accordance with the present disclosure provide an apparatus and a method for polishing a semiconductor substrate in semiconductor device manufacturing. The apparatus can include: a carrier configured to hold the substrate; a polishing pad configured to polish a first surface of the substrate; a chemical mechanical polishing (CMP) slurry delivery arm configured to dispense a CMP slurry onto the first surface of the substrate; and a pad conditioner configured to condition the polishing pad. In some embodiments, the pad conditioner can include a conditioning disk configured to scratch the polishing pad; a conditioning arm configured to rotate the conditioning disk; a plurality of magnetic screws configured to secure the conditioning disk onto the conditioning arm and including a respective plurality of screw heads; and a plurality of blocking devices respectively positioned beneath the plurality of screw heads and configured to block debris particles from entering a respective plurality of screw holes.

In some embodiments, an apparatus for surface conditioning includes: a conditioning disk configured to roughen a surface; a conditioning arm configured to translate and rotate the conditioning disk; a connection component configured to secure the conditioning disk onto the conditioning arm and including an upper surface; and a blocking component positioned beneath the upper surface of the connection component.

In some embodiments, a method for polishing an object includes securing the object onto a carrier; pressing the object against a polishing pad; dispensing a polishing slurry onto the polishing pad; rotating the object or the polishing pad; and conditioning, with a pad conditioner, the polishing pad. The pad conditioner can include a conditioning disk, a conditioning arm, a plurality of magnetic screws configured to secure the conditioning disk onto the conditioning arm, and a blocking device positioned beneath a screw head of each of the plurality of magnetic screws.

It is to be appreciated that the Detailed Description section, and not the Abstract of the Disclosure, is intended to be used to interpret the claims. The Abstract of the Disclosure section can set forth one or more but not all exemplary embodiments contemplated and thus, are not intended to be limiting to the subjoined claims.

The foregoing disclosure outlines features of several embodiments so that those skilled in the art can better understand the aspects of the present disclosure. Those skilled in the art will appreciate that they can readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they can make various changes, substitutions, and alterations herein without departing from the spirit and scope of the subjoined claims.

What is claimed is:

1. An apparatus for polishing a substrate, comprising:
   a carrier configured to hold the substrate;
   a polishing pad configured to polish a first surface of the substrate;
   a chemical mechanical polishing (CMP) slurry delivery arm configured to dispense a CMP slurry onto the first surface of the substrate; and
   a pad conditioner configured to condition the polishing pad, wherein the pad conditioner comprises:
      a conditioning disk configured to scratch the polishing pad;
      a conditioning arm configured to rotate the conditioning disk;
      a plurality of magnetic screws configured to secure the conditioning disk onto the conditioning arm and comprising a respective plurality of screw heads, wherein each of the plurality of magnetic screws is configured to magnetically attract particles within a corresponding magnetic screw hole; and
      a plurality of blocking devices respectively positioned beneath the plurality of screw heads and configured to block the particles from dislodging from a respective plurality of magnetic screw holes.

2. The apparatus of claim 1, further comprising a platen configured to support and rotate the polishing pad.

3. The apparatus of claim 1, wherein the carrier comprises a retainer ring configured to secure the substrate in a predetermined position.

4. The apparatus of claim 1, wherein the CMP slurry comprises a first reactant, an abrasive, a first surfactant, a solvent, or a combination thereof.

5. The apparatus of claim 1, wherein the conditioning arm is configured to extend over the polishing pad and sweep across a surface of the polishing pad.

6. The apparatus of claim 1, wherein the plurality of magnetic screws are located in a plurality of magnetic screw holes, and wherein each magnetic screw hole is between about 4 mm and about 8 mm.

7. The apparatus of claim 1, wherein the plurality of magnetic screws comprise iron, nickel, cobalt, or a combination thereof.

8. The apparatus of claim 1, wherein the plurality of blocking devices comprise a polymer.

9. The apparatus of claim 8, wherein the polymer comprises polyvinyl chloride, polytetrafluoroethylene, or a combination thereof.

10. The apparatus of claim 1, wherein the magnetic screw is configured to be removed from the magnetic screw hole to remove the particles.

11. The apparatus of claim 1, wherein each of the plurality of blocking devices is configured to fill a gap between each of the plurality of magnetic screws and the corresponding magnetic screw hole.

12. An apparatus for surface conditioning, comprising:
    a conditioning disk configured to roughen a surface;
    a conditioning arm configured to translate and rotate the conditioning disk;
    a magnetic connection component configured to magnetically attract particles within a corresponding magnetic connection component hole and further configured to secure the conditioning disk onto the conditioning arm and comprising an upper surface; and
    a blocking component positioned beneath the upper surface of the magnetic connection component.

13. The apparatus of claim 12, wherein the magnetic connection component comprises a magnetic screw.

14. The apparatus of claim 13, wherein the upper surface comprises a screw head of the magnetic screw.

15. The apparatus of claim 12, wherein the blocking component comprises a flange and a skirt.

16. The apparatus of claim 12, wherein the blocking component comprises a polymer having a shore hardness from about 5 shore A to about 80 shore D.

17. A method for polishing an object, comprising:
    securing the object onto a carrier;
    pressing the object against a polishing pad;
    dispensing a polishing slurry onto the polishing pad;
    rotating the object or the polishing pad; and
    conditioning, with a pad conditioner, the polishing pad, wherein the pad conditioner comprises a conditioning disk, a conditioning arm, a plurality of magnetic screws configured to secure the conditioning disk onto the conditioning arm, and a blocking device positioned beneath a screw head of each of the plurality of magnetic screws, wherein the blocking device is configured to block particles from dislodging from a corresponding plurality of magnetic screw holes.

18. The method of claim 17, further comprising removing the particles from the magnetic screws and the blocking device.

19. The method of claim 17, wherein conditioning the polishing pad comprises roughening, with the conditioning disk, the polishing pad.

20. The method of claim 17, wherein conditioning the polishing pad comprises translating and rotating, with the conditioning arm, the conditioning disk.

* * * * *

UNITED STATES PATENT AND TRADEMARK OFFICE
CERTIFICATE OF CORRECTION

PATENT NO. : 12,020,946 B2  
APPLICATION NO. : 16/194640  
DATED : June 25, 2024  
INVENTOR(S) : Tseng et al.

Page 1 of 1

It is certified that error appears in the above-identified patent and that said Letters Patent is hereby corrected as shown below:

On the Title Page

Item (57), in "Abstract", Line 17, before "exiting" delete "entering".

Signed and Sealed this  
Thirteenth Day of May, 2025

Coke Morgan Stewart  
*Acting Director of the United States Patent and Trademark Office*